US008828259B2

(12) United States Patent
Sato

(10) Patent No.: US 8,828,259 B2
(45) Date of Patent: Sep. 9, 2014

(54) METHODS FOR AUTOMATICALLY DETERMINING CAPACITOR VALUES AND SYSTEMS THEREOF

(75) Inventor: Arthur H. Sato, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 13/177,620

(22) Filed: Jul. 7, 2011

(65) Prior Publication Data
US 2013/0008871 A1 Jan. 10, 2013

(51) Int. Cl.
C03C 15/00 (2006.01)
H01J 37/32 (2006.01)

(52) U.S. Cl.
CPC ......... H01J 37/32183 (2013.01); H01J 37/321 (2013.01)
USPC .................... 216/86; 216/37; 216/67; 216/59; 438/14; 438/710; 438/714

(58) Field of Classification Search
None
See application file for complete search history.

(56) References Cited

U.S. PATENT DOCUMENTS

| | | | | |
|---|---|---|---|---|
| 5,467,883 | A * | 11/1995 | Frye et al. ..................... | 216/60 |
| 7,306,745 | B1 * | 12/2007 | Bhardwaj et al. .............. | 216/37 |
| 7,590,498 | B1 | 9/2009 | Chung et al. | |
| 2009/0284156 | A1 | 11/2009 | Banna et al. | |

OTHER PUBLICATIONS

"International Search Report", PCT Application No. PCT/US 12/5711, Mailing Date: Sep. 21, 2012.
"Written Opinion", PCT Application No. PCT/US 12/5711, Mailing Date: Sep. 21, 2012.
Bacelli, et al., "Impedance Matching Controller for an Inductively", ICINCO 2007—International Conference on Informatics in Control, Automation and Robotics, http://eprints.nuim.ie/1426/1/ImpedanceMatchingRingwood.pdf, 6 pages total.

* cited by examiner

Primary Examiner — Binh X Tran
Assistant Examiner — David Cathey, Jr.
(74) Attorney, Agent, or Firm — Martine Penilla Group, LLP

(57) ABSTRACT

A method for automatically performing power matching using a mechanical RF match during substrate processing is provided. The method includes providing a plurality of parameters for the substrate processing wherein the plurality of parameters including at least a predefined number of learning cycles. The method also includes setting the mechanical RF match to operate in a mechanical tuning mode. The method further includes providing a first set of instructions to the substrate processing to ignore a predefined number of cycles of Rapid Alternating Process RAP steps. The method yet also includes operating the mechanical RF match in the mechanical tuning mode for the predefined number of learning cycles. The method yet further includes determining a set of optimal capacitor values. The method moreover includes providing a second set of instructions to a power generator to operate in a frequency tuning mode.

19 Claims, 2 Drawing Sheets

METHODS FOR AUTOMATICALLY DETERMINING CAPACITOR VALUES AND SYSTEMS THEREOF

BACKGROUND OF THE INVENTION

Plasma has long been employed to process substrates (e.g., wafers or flat panels) to form electronic products (e.g., integrated circuits or flat panel displays). In plasma processing, a process gas may be injected into a chamber and energized to form a plasma to either deposit a layer on the substrate or to sputter or etch the substrate. In some processes, particularly those involving deep etching of the silicon layer, there exist various etch techniques that alternate etching and deposition sub-steps in order to perform the etch more anisotropically (e.g., forming sidewalls of the trenches or holes more vertically).

One of these techniques is known as the Rapid Alternating Process (RAP) process, which alternates etching and deposition cycles during etching. In the RAP process, different process parameters are utilized for the alternating deposition and etching cycles. These process parameters may include, for example, different chemistries, pressures, bias voltages, TCP (inductive coil) voltages, and the like. The alternating cycles are typically executed such that a deposition cycle would be followed by an etch cycle and then a deposition cycle and so on. The overall composite etch step may involve hundreds or even thousands of these alternating cycles.

When the cycles change from deposition to etching (or vice versa), there exists a transition period when transients in the chamber parameters make it challenging to perform power matching. As is well known in the art, plasma may be generated in inductive chambers using an antenna (such as an inductive coil), an RF generator and a match network. The match network is employed to ensure that the power delivered is matched with the load in order to minimize the reflected power and thereby maximizing power delivery to the load.

Generally speaking, a mechanical RF match tends to employ tunable capacitors whose capacitor values may be changed in order to accomplish the power matching. This mode of operation is referred to herein as the mechanical tuning mode. During the transition period between cycles, the mechanical RF match that is typically employed to perform power matching may have difficulties handling the rapidly fluctuating transient parameters. Furthermore, since a given RAP etch step may involve hundreds or even thousands of alternating cycles, the mechanical tuning mode (i.e., power matching by changing the settings of the tunable capacitors) tends to wear out the tunable capacitors fairly quickly. Due to these issues, frequency tuning has been proposed for performing power matching in plasma processing systems that employ mechanical RF match networks.

In frequency tuning, the capacitors in the mechanical RF match network are fixed at some values and the RF power supply varies the frequencies of the RF signals in order to match the power delivered to the load. Since the power delivered typically involves at least two components (e.g., real and imaginary), two tunable capacitors are typically employed.

To optimize power matching using frequency tuning, however, each of the tunable capacitors needs to be fixed at some value that is optimized for the specific recipe employed and/or the specific conditions of a given chamber. If the capacitors of the mechanical RF match are set at their optimal values for the recipe being employed and/or the specifics of plasma processing system involved, power matching via frequency tuning can be made more efficient.

In the prior art, the process of determining the capacitor values for fixing or setting the tunable capacitors in a mechanical RF match prior to performing frequency tuning tends to involve a manual and laborious trial-and-error approach. For example, multiple sample substrates may be processed multiple times in a given chamber to build a matrix. The optimal capacitor values for the tunable capacitors may be extracted from the matrix once processing of the multiple sample substrates is completed. After the optimal capacitor values are extracted or determined, these capacitor values can be employed to set the positions of the tunable capacitors, thereby setting the values of the tunable capacitors at the values that are determined to be optimal by the prior art process.

However, the manual, laborious, and time-consuming nature of the prior art capacitor value determination process negatively impacts the system substrate throughput. Further, the process tends to be error-prone due to the involvement of a human operator. Because of this, the values of the tunable capacitors are typically determined only once in advance and then employed for running multiple substrates since it is fairly costly and time consuming to perform the prior art capacitor value determination process It has been found, however, that chamber conditions do not stay unchanged over time. Phenomena such as chamber drift (e.g., a situation in which the chamber conditions change from substrate to substrate due to, for example, polymer deposition) renders the tunable capacitor values that are found to be optimally for the first substrate in the batch non-optimal for the Nth substrate in the batch. Accordingly, the etch result for the first substrate would be different from the etch result for the Nth substrate, thereby impacting the repeatability of the etch process and affects the quality of the end product.

Furthermore, the manual, laborious, and time consuming approach of the prior art capacitor value determination process, which involves processing multiple sample substrates prior to extracting the optimal capacitor values, also makes it nearly impossible to determine capacitor values on-the-fly in the middle of a long ramped RAP step. In a ramped RAP step, one or more parameters may change as the RAP step is executed. To elaborate using an example, as the etch proceeds deeper and deeper into a layer on the substrate to create a deep trench and as the trench is being alternatively etched and deposited using alternating cycles of a RAP step, the optimal parameters for etching that exist at the beginning of the RAP step would be different from the optimal parameters for etching at the Nth cycle of the RAP step. To ensure a satisfactory etch, chamber parameters (such as pressure, bias power, gas mixtures, etc.) may be changed during a long ramped RAP step. The change in these chamber parameters requires the power matching to be updated, which involves updating the tunable capacitor value settings since the capacitors values that are set at the beginning of the ramped RAP step may no longer be optimal at the Nth cycle of the ramped RAP process.

Ideally, the tunable capacitor values would be ascertained just prior to changing the tunable capacitor value settings. As mentioned, a long ramped RAP step may require multiple capacitor value setting changes in order to adapt to condition changes. However, since the prior art process would require the cessation of the current RAP step, opening the chamber and running multiple sample substrates, and extracting the optimal tunable capacitor values from the sample substrate runs, it is impossible to duplicate conditions that exist at a given cycle in the middle of a RAP step to facilitate the discovery of the optimal tunable capacitor values at that given cycle in the middle of a RAP step.

In the view of the foregoing, there are desired improved, more efficient, and more automated process for discovering the optimal values for the tunable capacitors of a mechanical RF match network for a frequency tuning/power matching application in a plasma processing system.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
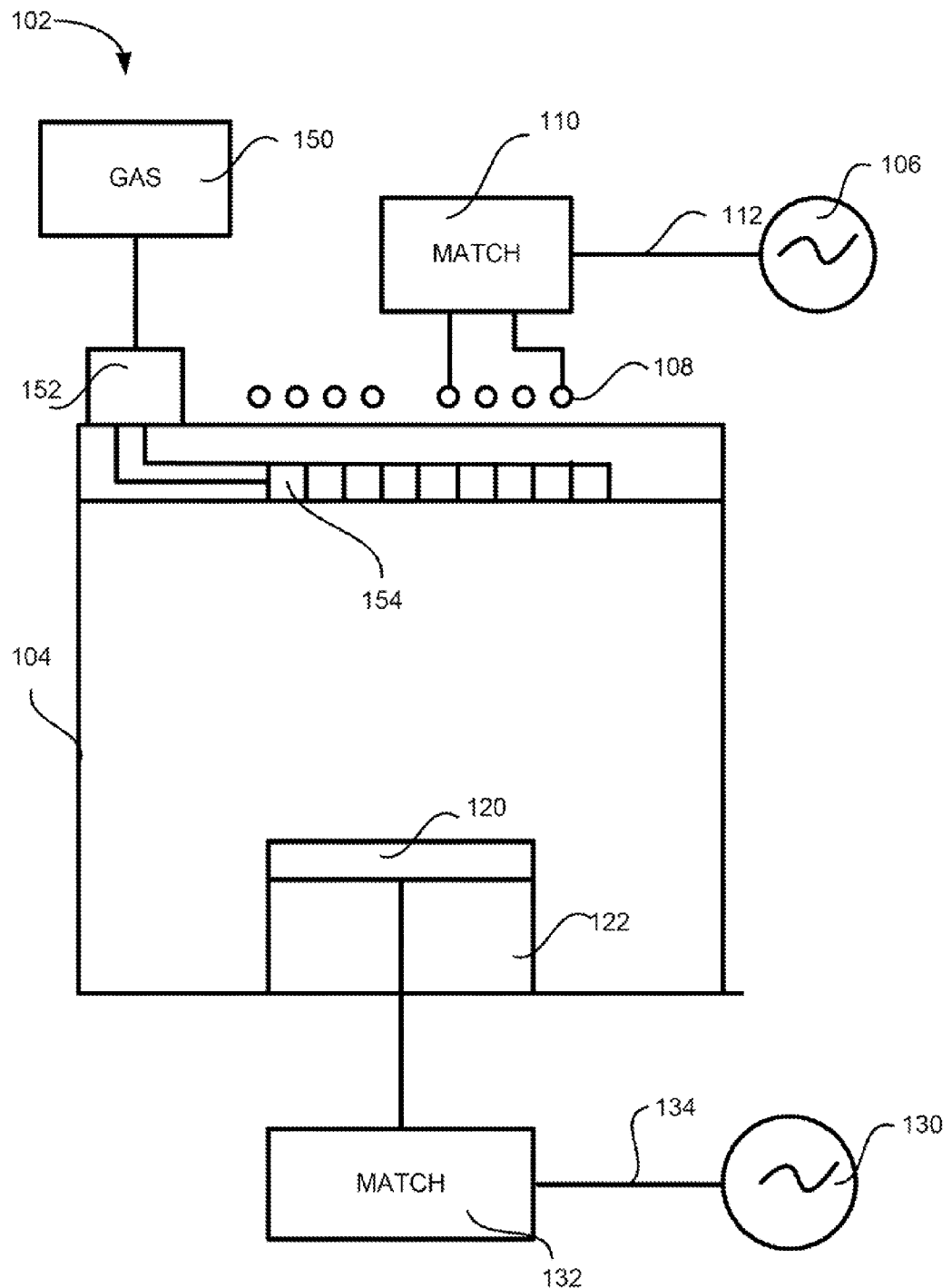
FIG. 1 shows a typical inductively coupled plasma processing chamber, including a chamber enclosure.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to methods and systems for automatically determining the capacitor values in a mechanical RF match when executing process steps that involve frequency tuning (such as a RAP etch step). In one or more embodiments of the invention, the operator may specify up to three values in order to start the process. The first value (which may be optional) pertains to the number of cycles to ignore at the beginning of the automated optimal capacitor value determination (AOCVD) process. This step is to account for any possible transients that may exist upon power start-up or any possible transients that may exist due to other causes that need to be ignored before the start of the AOCVD process.

The second specified value pertains to the number of cycles to run in the mechanical tuning mode while capacitor value logging is performed. The logged capacitor values are then averaged over the number of cycles specified in order to derive the optimal capacitor value for each capacitor. The third specified value (which may be optional) pertains to the number of cycles that the RF match may continue to be run in the mechanical tuning mode after the frequency tuning is initiated by the RF power supply.

Once these values are supplied by the operator, the method first ignores the number of cycles (as provided by the operator) prior to the start of the AOCVD process. In one or more embodiments, the number of cycles to be ignored may vary from zero to five, more preferably from zero to two.

Next the mechanical RF match is operated in the mechanical tuning mode. During the mechanical tuning mode, the capacitor values usually as the mechanical RF match attempts to match the power delivered to the load. The mechanical tuning mode is executed over a predefined number of cycles as specified by the operator. In one or more embodiments, the number of learning cycles executed in the mechanical tuning mode may vary from three to fifteen, and more preferably from five to ten.

During the time that the RF mechanical RF match is run in the mechanical tuning mode, data regarding the positions (or values) of the capacitors (usually two capacitors) are logged or stored. After the predetermined number of cycles has been run, the AOCVD process may calculate an average capacitor position/value for each capacitor. Once the average capacitor position/value has been determined, instructions are then sent to the RF power supply to operate in a frequency tuning mode. In some instances, the mechanical RF match may continue to operate in the mechanical tuning mode, in an overlapping manner with the frequency tuning mode of the RF power supply. The number of overlapping cycles is determined by the operator and is the third values that may be entered at the beginning of the process. In many cases; the overlap cycle value may be as few as zero to signify that the mechanical tuning mode can be turned off and the system can immediately transition into a frequency tuning mode. In one or more embodiments, the number of overlapping cycles may vary from zero to five, and more preferably from zero to two.

The features and advantages of embodiments of the invention may be better understood with reference to the figures and discussions that follow.

FIG. 1 shows a typical inductively coupled plasma processing chamber 102, including a chamber enclosure 104. There is shown a RF generator 106, which provides RF power to antenna 108 via a TCP match network 110 and a TCP coaxial cable 112. The purpose of TCP match network 110 is to minimize the reflected power and to maximize power delivery from RF generator 106 to antenna 108.

A substrate 120 is disposed on top of ESC (electrostatic chuck) 122. In practice, ESC chuck 122 is insulated from the rest of chamber enclosure 104 using an appropriate insulator structure (conventional and not elaborated in FIG. 1). ESC chuck 122 is biased with RF power using a bias RF generator 130, which provides bias RF energy to ESC chuck 122 through a bias match network 132 and a bias RF power coaxial cable 134.

A gas delivery system 150 may include one or more gas sources such as gas cylinders, associated manifolds, valves and the like. Gas delivery system 150 is employed to provide the process source gas (such as source etchant and/or deposition gas) to the interior volume of chamber 102 via a port 152 and a showerhead arrangement 154. During processing, the process source gas is ignited by RF generator 106 and/or bias RF generator 130 into a plasma inside chamber 102 for processing substrate 120.

TCP match network 110 represents mechanical RF match network and may employ, for example, a phase/magnitude sensor to detect the phase and the magnitude of the RF signal delivered. In a mechanical tuning mode, TCP match network 110 may employ the phase and magnitude information to compute, via appropriate logic circuitry or via software, the optimal values for the match tunable capacitors.

If chamber 102 is employed for the RAP process, RF generator 106 is typically a generator that can operate in either a fixed frequency mode (such as 13.56 Megahertz or some other suitable RF frequency) or in a frequency tuning mode (variable frequency mode) whereby different RF frequencies are provided in order to perform the power matching function. In one example implementation, when RF generator 106 operates in the RF frequency tuning mode, one or more power sensors may detect the delivered and reflected power and may attempt to minimize the reflected power in order to maximize delivery to the load.

Figure 2:
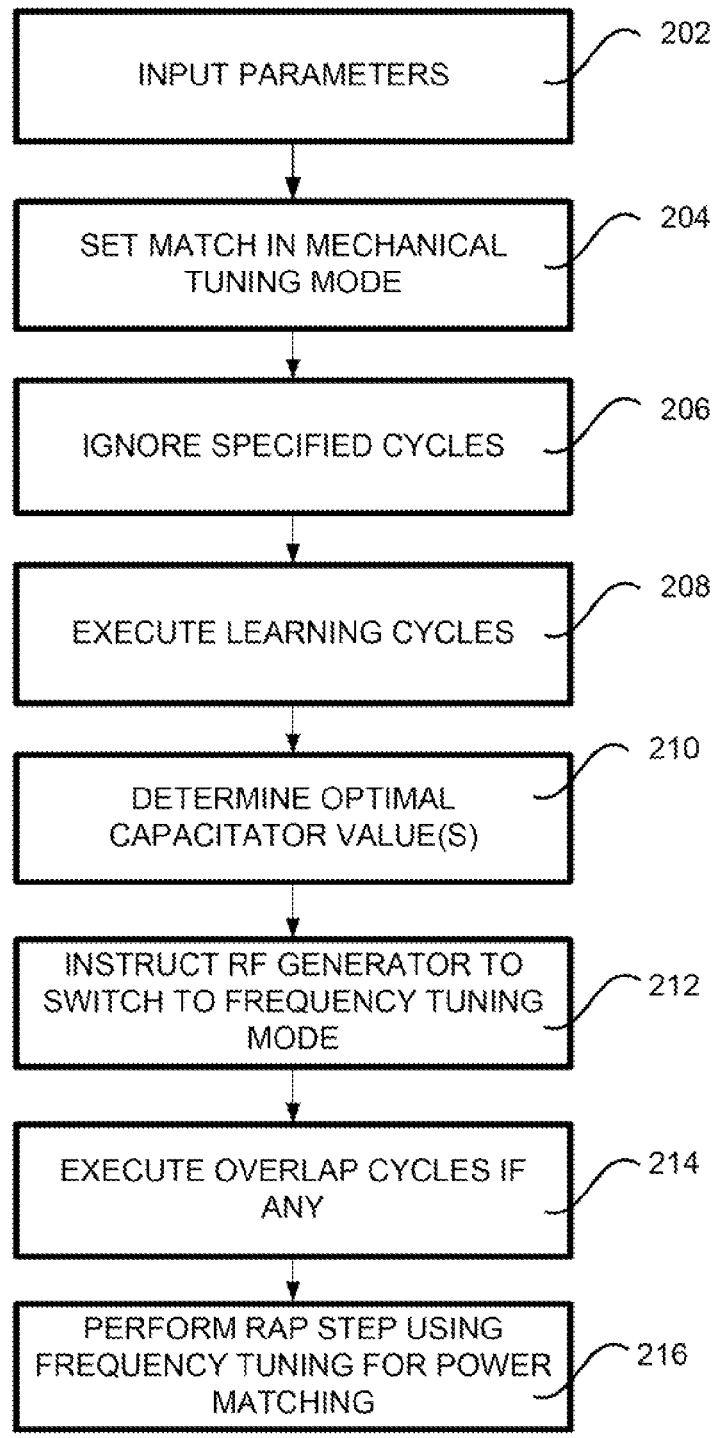
FIG. 2 shows, in accordance with an embodiment of the invention, the steps involved in performing the automated optimal capacitor value determination (AOCVD) process.

FIG. 2 shows, in accordance with an embodiment of the invention, the steps involved in performing the automated optimal capacitor value determination (AOCVD) process. The AOCVD process of FIG. 2 may be performed at the beginning of a RAP step or may be performed multiple times during a single RAP step to account for such situations as parameter ramping or chamber drill.

In step 202, the operator may input, as part of the process of inputting parameters for the recipe, up to three values. The operator may input the number of cycles to ignore prior to starting the AOCVD process, the number of cycles for the AOCVD process itself, and the number of cycles that the mechanical RF match may continue to operate in an overlapping manner with the RF power supply after the RF power supply has initiated frequency tuning.

In step 204, the mechanical RF match (106 of FIG. 1) is set up to operate in the mechanical tuning mode and the RF generator (110 of FIG. 1) is operated in the fixed frequency mode such as at 13.56 Megahertz or another suitable frequency.

In step 206, the process begins by ignoring a number of cycles of the RAP step as instructed by the operator in step 202. In step 208, the mechanical RF match operates in the mechanical tuning mode for the number of learning cycles that is specified in step 202. During step 208 data related to the value(s) of the tunable match capacitor(s) or the position(s) of the tunable match capacitor(s) is logged or stored.

In step 210, the capacitor positions or capacitor values are averaged over the number of learning cycles specified in step 202. The calculated average capacitor position(s) or value(s) are then loaded as preset values for the tunable capacitor(s) of the mechanical RF match network.

In step 212, a command is sent from the mechanical RF match to the RF generator to instruct the RF generator change to frequency tuning mode. In step 214, the TCP mechanical RF match may continue to operate in the mechanical tuning mode for the number of overlapped cycles (or time duration) as specified by the operator in step 202. If zero is specified as the overlap time or as the number of overlap cycles, the transition of the mechanical RF match from the mechanical tuning mode to the fixed mode may be instantaneous and contemporaneous with the change from a fixed frequency mode to a variable frequency mode by the RF generator to implement frequency tuning.

In step 214, a command may also be sent to set the RF match tunable capacitors to the preset positions that have been calculated in step 210. Thereafter, the process continues to operate in the frequency tuning mode (step 216) until the next time that the AOCVD process is required again, which may be at the start of the next RAP step or during the existing RAP step.

As can be appreciated from the foregoing, embodiments of the invention automate the process of determining the optimal value(s) of the RF match tunable capacitor(s) prior to switching the RF generator from the fixed mode of operation to the frequency tuning mode to facilitate power matching. By automating the process of determining the optimal capacitor value(s) for the mechanical RF match tunable capacitor(s), the time-consuming and laborious process required to determine the capacitor values in the prior art may be eliminated.

Since the optimal tunable capacitor values can be determined automatically at the start of every RAP step or even during a RAP step, embodiments of the invention are better able to handle chamber drift whereby the chamber conditions change from substrate to substrate. This is useful whether a given recipe involves only a single RAP step or multiple RAP steps (which may be interleaved with non-RAP steps). Accordingly, even if the chamber conditions change from one RAP step to the next RAP step (or even while in the middle of performing a RAP step), the optimal value(s) for the tunable match capacitor(s) can be readily determined without the need to stop the RAP step or to stop substrate processing and remove the substrate to run test sample substrates.

Further, as the recipe becomes more complex and may involve parameter ramping in the middle of a RAP step, the automatic optimal capacitor value determination process, which can be performed on-the-fly in the middle of a RAP step, is better able to optimize power delivery to the load via the frequency tuning mode of power matching without the need to stop the RAP step and remove the substrate to run test sample substrates.

While this invention has been described in terms of several preferred embodiments, there are alterations, permutations, and equivalents, which fall within the scope of this invention. For example, although an inductively coupled chamber and more specifically a TCP (transformer coupled plasma) chamber is employed to facilitate discussion in the specification, the invention also applies to other types of plasma chambers such as capacitively coupled chambers (single or multiple RF frequencies), microwave, ECR, etc. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for automatically performing power matching using a mechanical RF match during substrate processing in a plasma processing system, comprising:

providing a plurality of parameters for said substrate processing wherein said plurality of parameters including at least a predefined number of learning cycles;

setting said mechanical RF match to operate in a mechanical tuning mode;

providing a first set of instructions to ignore a predefined number of cycles of a Rapid Alternating Process (RAP)

step, the predefined number of cycles of the RAP step being either one cycle, two cycles, three cycles, four cycles, or five cycles;

operating said mechanical RF match in said mechanical tuning mode for said predefined number of learning cycles, wherein said predefined number of learning cycles occur after said predefined number of cycles of said RAP step have been ignored;

determining a set of optimal capacitor values; and providing a second set of instructions to said power generator to switch from said fixed frequency mode to a frequency tuning mode.

2. The method of claim 1 further including assigning said set of optimal capacitor values to a set of tunable capacitors of said mechanical RF match; and terminating said mechanical tuning mode when a predefined number of overlapping cycles have been reached.

3. The method of claim 1 wherein said power generator is an RF power supply.

4. The method of claim 1 wherein said determining of said set of optimal capacitor values includes gathering data during said substrate processing, wherein said data including at least a set of values relating to a set of tunable capacitors, and calculating an average based on said data gathered.

5. The method of claim 1 wherein said performing power matching is performed at the beginning of said RAP step.

6. The method of claim 1 wherein said performing power matching is performed dynamically during said RAP step.

7. The method of claim 1 wherein said plasma processing system is an inductively coupled plasma processing system.

8. A method for automatically performing power matching using a mechanical RF match during substrate processing in a plasma processing system, comprising:

providing a plurality of parameters for said substrate processing, wherein said plurality of parameters including at least a predefined number of learning cycles;

thereafter, setting said mechanical RF match to operate in a mechanical tuning mode;

thereafter, setting a power generator to operate in a fixed frequency mode;

thereafter, providing a first set of instructions to ignore a predefined number of cycles of a Rapid Alternating Process (RAP) step, the predefined number of cycles of the RAP step being either one cycle, two cycles, three cycles, four cycles, or five cycles;

thereafter, operating said mechanical RF match in said mechanical tuning mode for said predefined number of learning cycles, wherein said predefined number of learning cycles occur after said predefined number of cycles of said RAP step have been ignored;

thereafter, determining a set of optimal capacitor values; and thereafter, providing a second set of instructions to said power generator to switch from said fixed frequency mode to a frequency tuning mode.

9. The method of claim 8 further including assigning said set of optimal capacitor values to a set of tunable capacitors of said mechanical RF match; and thereafter, terminating said mechanical tuning mode when a predefined number of overlapping cycles have been reached.

10. The method of claim 8 wherein said power generator is an RF power supply.

11. The method of claim 8 wherein said determining of said set of optimal capacitor values includes gathering data during said substrate processing, wherein said data including at least a set of values relating to a set of tunable capacitors, and thereafter, calculating an average based on said data gathered.

12. The method of claim 8 wherein said performing power matching is performed at the beginning of said RAP step.

13. The method of claim 8 wherein said performing power matching is performed dynamically during said RAP step.

14. The method of claim 8 wherein said plasma processing system is an inductively coupled plasma processing system.

15. A computer-implemented method for automatically performing power matching using a mechanical RF match during substrate processing in a plasma processing system, comprising computer-implemented steps of:

receiving a plurality of parameters for said substrate processing wherein said plurality of parameters including at least a predefined number of learning cycles;

setting said mechanical RF match to operate in a mechanical tuning mode;

operating said mechanical RF match in said mechanical tuning mode for said predefined number of learning cycles;

determining a set of optimal capacitor values from capacitor values obtained while said mechanical RF match is operated in said mechanical tuning mode, said determining said set of optimal capacitor values being performed after a number of cycles of a Rapid Alternating Process (RAP) step has been ignored, the number of cycles being either one cycle, two cycles, three cycles, four cycles, or five cycles;

assigning said set of optimal capacitor values to a set of tunable capacitors of said mechanical RF match; and providing a second set of instructions to a power generator to operate in a frequency tuning mode.

16. The computer-implemented method of claim 15 further including a computer-implemented step of terminating said mechanical tuning mode after a predefined number of overlapping cycles have been reached.

17. The computer-implemented method of claim 15 wherein said power generator is an RF power supply.

18. The computer-implemented method of claim 15 wherein said determining said set of optimal capacitor values includes calculating an average based on said capacitor values obtained while said mechanical RF match is operated in said mechanical tuning mode.

19. The computer-implemented method of claim 15 wherein said power matching is performed dynamically during a RAP step.

* * * * *